United States Patent
Yang

(10) Patent No.: US 8,143,641 B2
(45) Date of Patent: Mar. 27, 2012

(54) INTEGRATED-TYPE LED AND MANUFACTURING METHOD THEREOF

(76) Inventor: Chiu-Jung Yang, Taichung (TW)

( * ) Notice: Subject to any disclaimer, the term of this patent is extended or adjusted under 35 U.S.C. 154(b) by 158 days.

(21) Appl. No.: 11/791,159

(22) PCT Filed: Oct. 26, 2005

(86) PCT No.: PCT/CN2005/001766
§ 371 (c)(1),
(2), (4) Date: May 18, 2007

(87) PCT Pub. No.: WO2006/056121
PCT Pub. Date: Jun. 1, 2006

(65) Prior Publication Data
US 2008/0087900 A1    Apr. 17, 2008

(30) Foreign Application Priority Data
Nov. 24, 2004 (CN) .......................... 2004 1 0084491

(51) Int. Cl.
*H01L 33/00* (2010.01)
(52) U.S. Cl. .................. 257/99; 257/E23.02; 438/28
(58) Field of Classification Search ............ 257/98–100, 257/E23.02; 438/25
See application file for complete search history.

(56) References Cited

U.S. PATENT DOCUMENTS

| 6,357,893 | B1 * | 3/2002 | Belliveau ................ 362/285 |
| 6,773,938 | B2 * | 8/2004 | Wood et al. ................ 438/15 |
| 6,949,772 | B2 * | 9/2005 | Shimizu et al. .............. 257/99 |
| 6,977,396 | B2 * | 12/2005 | Shen et al. ................ 257/100 |
| 7,242,086 | B2 * | 7/2007 | Tamura et al. .............. 257/701 |
| 7,375,381 | B2 * | 5/2008 | Shimizu et al. ............. 257/98 |
| 2005/0214968 | A1 * | 9/2005 | Waitl et al. ............... 438/106 |
| 2006/0038542 | A1 * | 2/2006 | Park et al. ................ 323/229 |
| 2006/0291029 | A1 * | 12/2006 | Lin et al. ................. 359/224 |

FOREIGN PATENT DOCUMENTS

JP   WO2004006895   *   6/2004
WO   WO 2004068595 A1 *   8/2004

\* cited by examiner

*Primary Examiner* — Matthew W Such
*Assistant Examiner* — Ali Naraghi

(57) ABSTRACT

The present invention provides an integrated-type LED and method for manufacturing the same. This integrated-type LED comprises a base board which having a preplaced circuit and at least one LED chip. P electrode and N electrode of the LED chip are respectively connected, conducting and fixing on the base board; The manufacturing method is a) making and arranging circuit on the base board, b) installing at least one LED chip on the base board, aligned P electrode and N electrode of LED chip with the corresponding circuit on the base board, c) directly connecting P electrode and N electrode of LED chip, conducting and fixing on the base board. The present invention has the advantage of good dispersing heat effect, low cost, high lifetime and high luminescent efficiency.

6 Claims, 5 Drawing Sheets

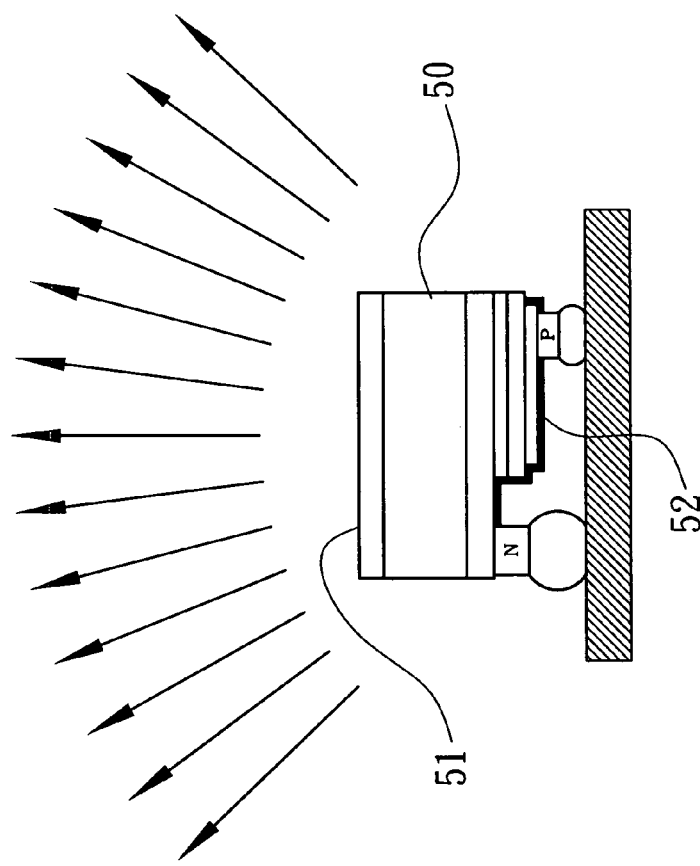
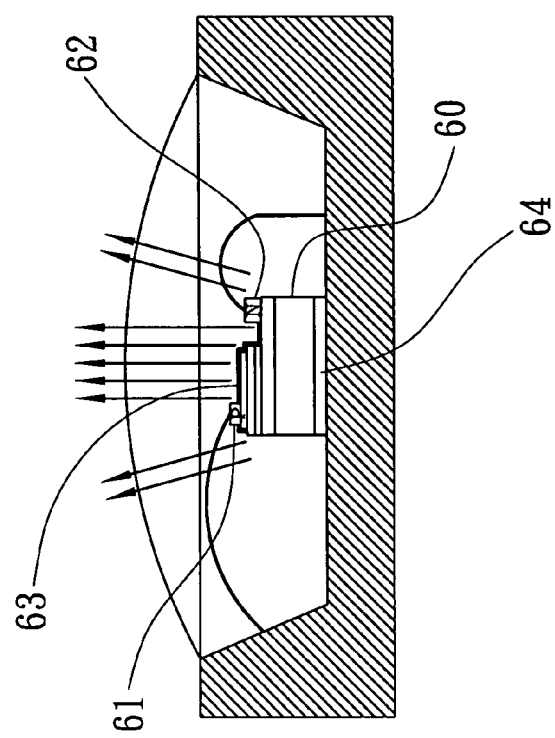
FIG. 4A
FIG. 4B

INTEGRATED-TYPE LED AND MANUFACTURING METHOD THEREOF

FIELD OF THE INVENTION

The present invention relates to an integrated-type light emitting diode (LED) and a method for manufacturing the integrated-type LED.

BACKGROUND OF THE INVENTION

Referring to FIG. 3 for the comparison of different types of manufacturing processes of a light emitting diode (LED), three common LED manufacturing processes are described as follows:

The first type of manufacturing process is provided for manufacturing an LED lamp, and its chip 10 is fixed onto a lead frame 11 first, and then gone through wire bonding 12, and finally packaged by encapsulation 13. In use, a hole is drilled on the circuit base board 14 for installing and soldering an LED lamp to complete the manufacturing process of the LED lamp.

The second type of manufacturing process is provided for manufacturing a surface mount device (SMD) LED, and its chip 20 is fixed onto a package substrate 21 first, and then gone through wire bonding 22, and finally packaged by encapsulation 23. In use, the circuit base board 24 is soldered onto the packaged product.

The third type of manufacturing process is provided for manufacturing a flip chip LED as illustrated in Taiwan Utility Model Pat. Application No. 092217642, and this type of manufacturing process includes the steps of: preparing a chip 30 and a flip chip base board 31; soldering the chip 30 and flip chip base board 31 by high-frequency waves 32; packaging the chip 30 by encapsulation 33; and finally soldering the finished goods onto the circuit base board 34 for its use.

In view of the foregoing three types of conventional manufacturing processes, their common deficiencies include a complicated manufacturing process, expensive packaging equipments, a poor heat dissipation effect of the LED, and a low LED brightness due to packaging materials deformed by heat and other factors.

SUMMARY OF THE INVENTION

The primary objective of the present invention is to overcome the foregoing shortcomings of the prior art by providing an integrated-type LED.

Another objective of the present invention is to provide a manufacturing method of an integrated-type LED.

To achieve the foregoing objective, the present invention provides an integrated-type LED, comprising a base board having a preinstalled circuit and at least one LED chip, and the P and N electrodes of the LED chip are connected, conducted and fixed to the circuit of the base board.

The P and N electrodes of the aforementioned LED chip are connected in series or in parallel, conducted and fixed to the circuit of the base board.

The aforementioned LED chips are red (R), blue (B) and green (G) LED chips. The base board is a multi-layer base board. The R, B, G LED chips are stacked, connected, conducted and fixed to the circuit of the multi-layer base board.

The P and N electrodes of the aforementioned LED chip are connected, conducted, and fixed to the circuit of the base board by a solder paste, conductive adhesive, gold ball, solder ball or silver ball soldering.

The LED further includes a packaging layer, and the LED chip is encapsulated in the packaging layer.

The technical measure taken for achieving the aforementioned other objective of the present invention is described as follows:

The method for manufacturing an integrated-type LED comprises the steps of:
(a) producing a circuit on the base board;
(b) installing at least one LED chip on the base board, and aligning the P and N electrodes of the LED chip with the corresponding circuit on the base board; and
(c) connecting, conducting and fixing the P and N electrodes of the LED on the base board.

The P and N electrodes of the aforementioned at least one LED chip are connected, conducted and fixed closely to the circuit of the base board.

The aforementioned LED chips are R, B and G LED chips. The aforementioned base board is a multi-layer base board. The R, B, G LED chips are stacked, connected, conducted, and fixed to the circuit of the multi-layer base board.

The P and N electrodes of the aforementioned LED chip are connected, conducted and fixed to a circuit of the base board by a solder paste, conductive adhesive, gold ball, solder ball or silver ball soldering.

The manufacturing method of the invention further comprises a step of packaging the LED obtained from Step (c).

Compared with a conventional LED, the integrated-type LED of the present invention has the following features:

1. Structure: The conventional LED is a flip chip LED, which is manufactured by an LED chip and a flip chip base board. The integrated-type LED of the invention directly uses the electrodes of an LED chip to make the SMD, and thus the chip is considered as a packaged SMD (having substantially the same structure, except that the chip is not packaged).

2. Soldering Materials: The conventional LED and the flip chip base board LED can be combined by high-frequency waves only, and thus incurring a significantly high cost. The integrated-type LED of the invention is soldered by gold ball, solder ball, conductive adhesive or solder paste directly by a traditional soldering furnace, and thus incurring a low cost.

3. Mechanical Manufacture: The conventional flip chip LED adopts a special high-frequency mechanical manufacturing process to produce flip chips, and goes through the packaging process before it can be manufactured and fixed onto the circuit of the base board by a traditional soldering furnace or a conductive adhesive. The integrated-type LED of the invention does not require packaging the LED, but simply solders the LED onto the circuit base board by a traditional soldering furnace.

The improvement of the present invention includes the features of the LED chip being connected, conducted and fixed directly to a preinstalled circuit of the base board, and the simple and easy method features a good heat dissipation effect, a low cost, a high light emission rate and a long lifetime. The LED chips are connected, conducted and fixed directly onto the LED chip of the base board in series or in parallel to achieve the effects of reducing the space of the base board, or installing more LED chips. In addition, the invention can have different combinations of modulated voltage and current, and the LED chips are connected, conducted and fixed directly onto the base board to stack, connect, conduct and fix the three types of red, green and blue chips to the base board circuit, so as to achieve the effect of mixing the three colors to produce a white light LED.

BRIEF DESCRIPTION OF THE DRAWINGS

FIG. 4A is a schematic view of a light emitting area of a common LED;

FIG. 4B is a schematic view of a light emitting area of an integrated-type LED of the present invention;

DETAILED DESCRIPTION OF THE PREFERRED EMBODIMENTS

To make it easier for our examiner to understand the present invention, the following detailed description with reference to the accompanying drawings of embodiments are given for example, but such preferred embodiment is not intended to limit the scope of the present invention. For simplicity, like numerals are used for like elements for the description of the specification of the present invention.

Figure 2:
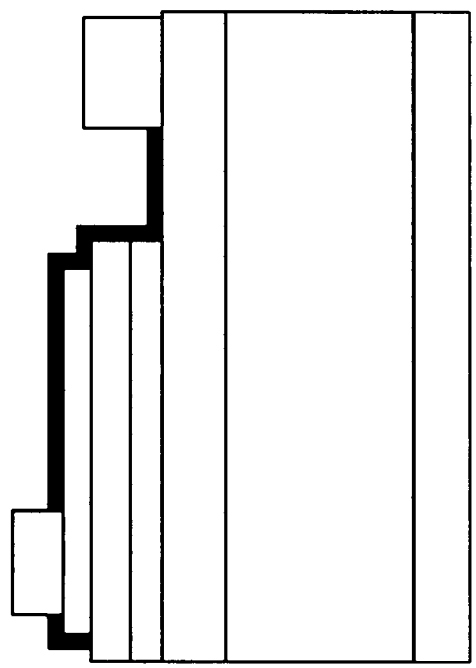
FIG. 2 is a side cross-sectional view of an LED chip.
Figure 1:
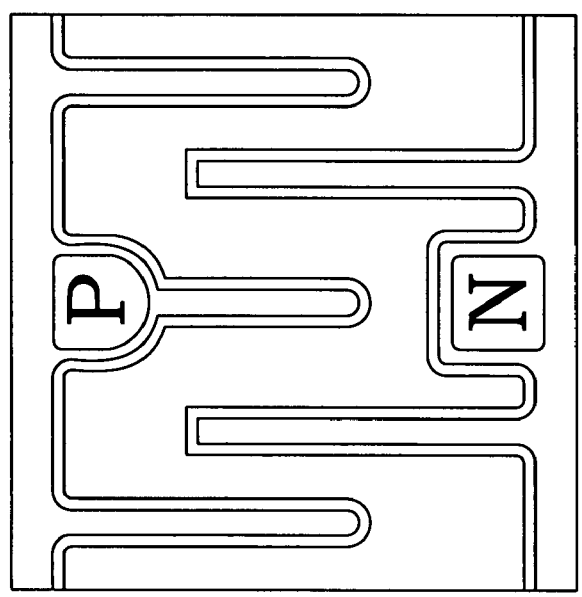
FIG. 1 is a top view of an LED chip.

Referring to FIGS. 1 and 2 for top and side cross-sectional views of an LED chip, the LED chip has a core comprised of a P-type semiconductor, an N-type semiconductor, and a transitional layer (which is generally called P-N junction) disposed between the P-type semiconductor and the N-type semiconductor. In the P-N junction of certain semiconductor materials, remaining energy will be released in the form of light during a recombination of minority carriers and majority carriers, such that the electric energy is converted directly into light energy. If a reverse voltage is applied to the P-N junction, then the minority carriers cannot be injected easily, and thus light cannot be emitted. A diode made by this injection method is called a light emitting diode (LED). If the LED is operated at a positive operating state (i.e. a positive voltage is applied to both electrodes), the current will flow from the anode to the cathode of the LED, and the semiconductor crystal will emit different color lights ranging from ultraviolet to infrared, and the intensity of the light is related to the intensity of the current.

Figure 3:
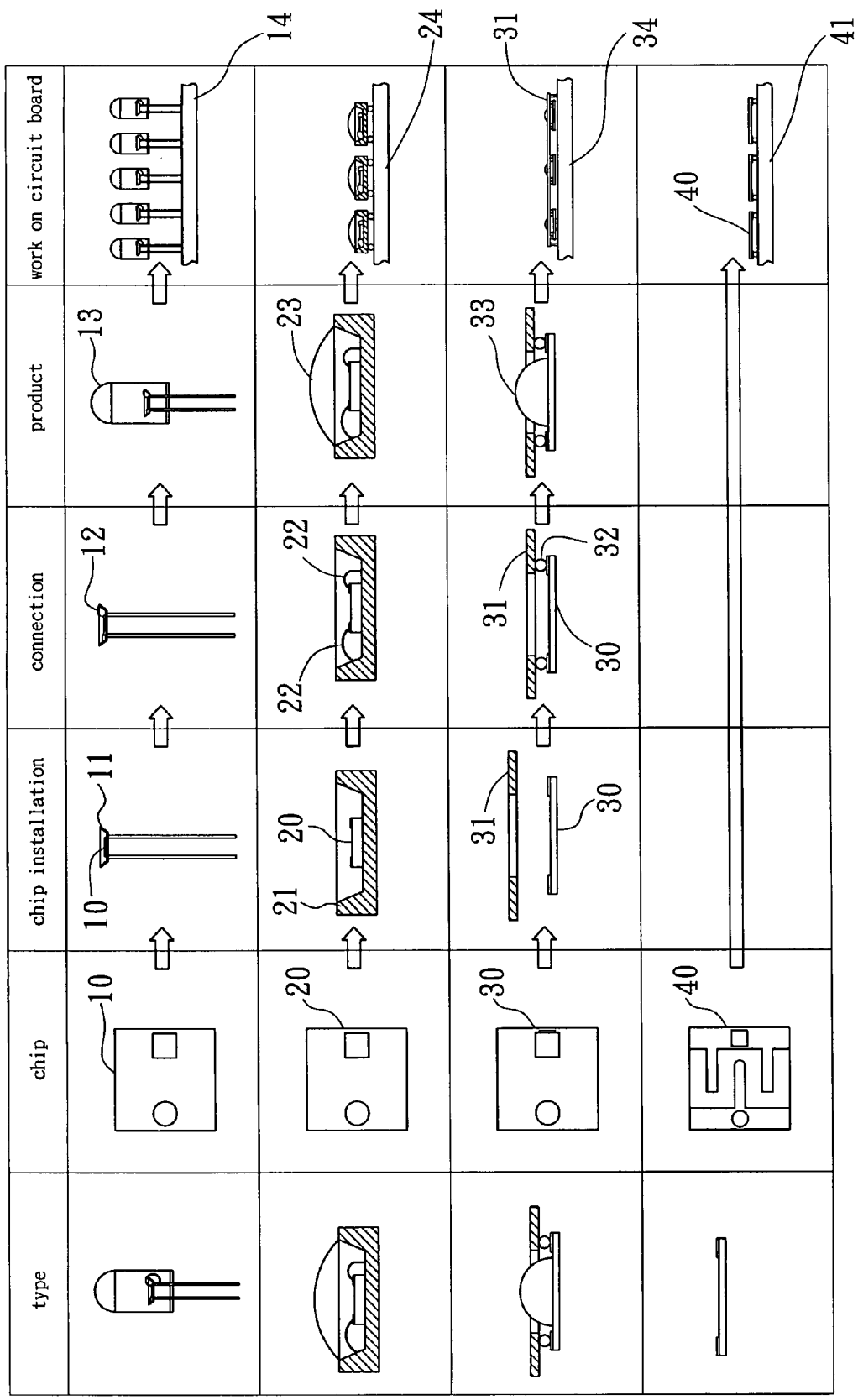
FIG. 3 shows the comparison of different types of LED manufacturing processes.

Referring to FIG. 3 for the comparison of different types of LED manufacturing processes, three common LED manufacturing processes are adopted and compared with the manufacturing process of an integrated-type LED in accordance with the present invention, and the difference among the four types of manufacturing processes is given below. The first type of manufacturing process is provided for manufacturing an LED lamp, a chip 10 is fixed to a lead frame 11, gone through wire bonding 12, and packaged by encapsulation 13. In use, a hole is drilled on the base board 14 for installing and soldering the LED lamp to complete the manufacturing process of an LED lamp. The second type of manufacturing process is provided for manufacturing a surface mount device (SMD) LED, and a chip 20 is fixed onto a package substrate 21, gone through wire bonding 22, and packaged by encapsulation 23. In use, the packaged product is soldered to a circuit 24 of the package substrate 21. The third type of manufacturing process is provided for manufacturing a flip chip LED as shown in Taiwan Utility Model Pat. Application No. 092217642, and the manufacturing process includes the steps of: preparing a chip 30 and a flip chip base board 31, soldering the chip 30 to the flip chip base board 31 by the high-frequency soldering method 32, packaging the chip 30 by encapsulation 33, and soldering the packaged chip 30 to the circuit 34 of the base board 31.

The manufacturing process of the present invention comprises the steps of:

(a) producing a circuit on the base board;

(b) installing at least one LED chip on the base board, and aligning the P and N electrodes of the LED chip with the corresponding circuit on the base board; and (c) connecting, conducting and fixing the P and N electrodes of the LED on the base board.

The P and N electrodes of the LED chip are connected, conducted and fixed closely to the circuit of the base board, so that direct connection, conduction and fixture provide a good heat dissipation effect. In addition, the simple and easy manufacturing process can reduce the manufacturing cost, and the LED so produced has the features of a high brightness, since the emitted light is not blocked. The chip 40 of the invention is not encapsulated, and thus no longer requires a small base board. The chip 40 can be connected, conducted and fixed directly onto the circuit of the base board 41. The invention not only simplifies the manufacturing process and lowers the manufacturing cost, but also provides a good heat dissipation effect.

Referring to FIGS. 4A and 4B, both front and back sides of an LED chip can emit light, and the LED chip 50 of the present invention uses a material with a high light transmission and an effect of protecting the chip for making the back side 51, so that the whole surface of the back side 51 can emit lights without any interference. The front side 52 faces towards the circuit of the base board. The surface of the front side has gone through solder mask and oxidation-resisting processing and comes with an appropriate design of electrodes. In general, a common LED 60 emits light from the front side 63 and the back side 64 serves as a fixing surface only. The back side 64 of a conventional LED is usually blocked by the soldering positions of the P and N electrodes 61, 62. Obviously, the LED 50 of the present invention can have a larger light emitting area than a conventional LED.

Figure 5:
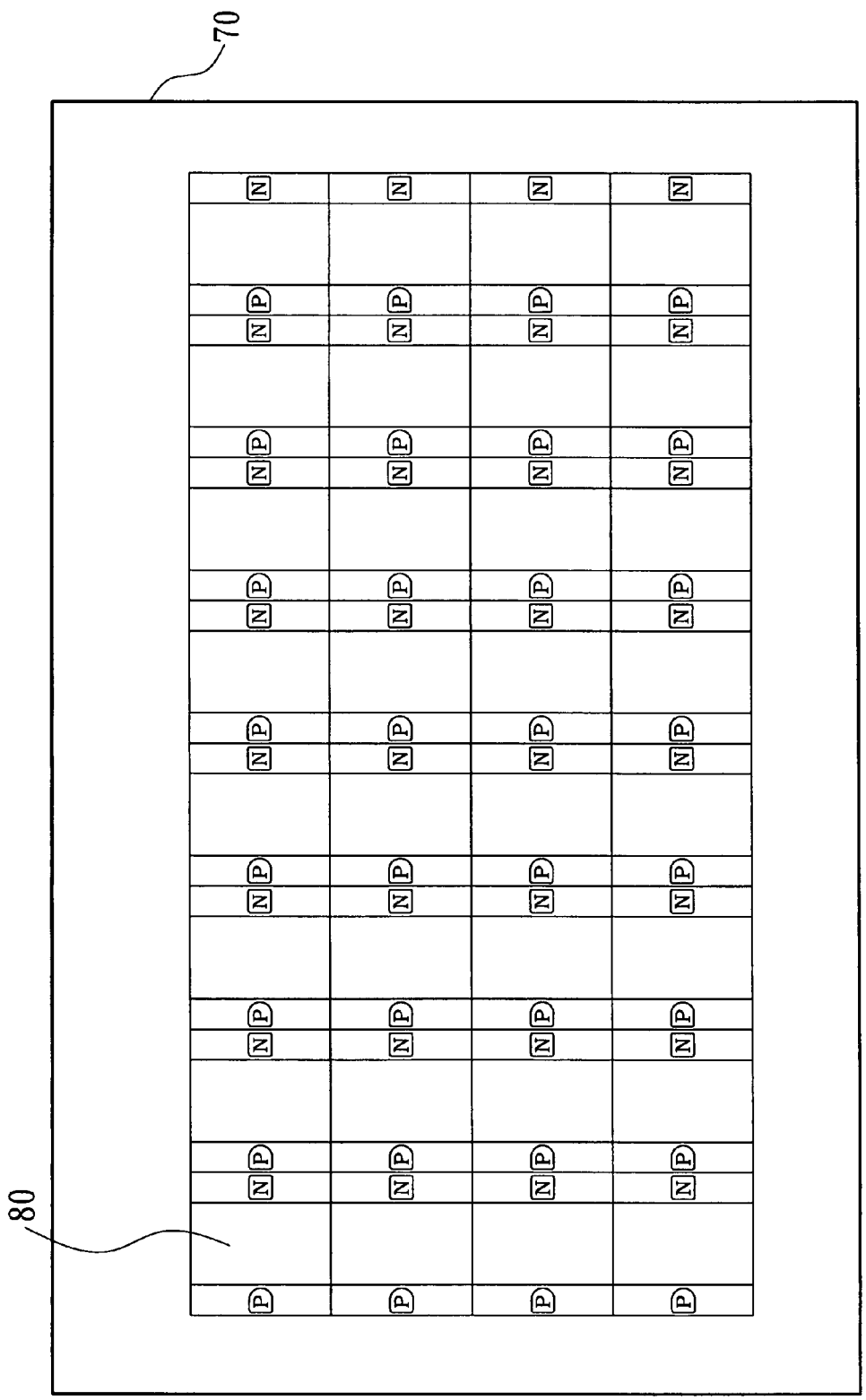
FIG. 5 is a schematic view of assembling an integrated-type LED in accordance with a preferred embodiment of the present invention.

Referring to FIG. 5, a circuit is preinstalled on a base board 70, and a plurality of chips 80 are connected, conducted and fixed onto the base board 70, and a P electrode is connected to a positive terminal of a power source, and an N electrode is connected to a negative terminal of a power source, wherein the P electrode and N electrode are connected in series, such that several LED chips can be connected in series or in parallel with each other, conducted and fixed closely to the circuit of the base board, so as to reduce the space of the base board or install more LED chips. Since any combination of the forgoing chips can be connected in series or in parallel to adjust voltage and current, the chips can be combined in series and in parallel to provide various different combinations of voltage, current and brightness.

Figure 6:
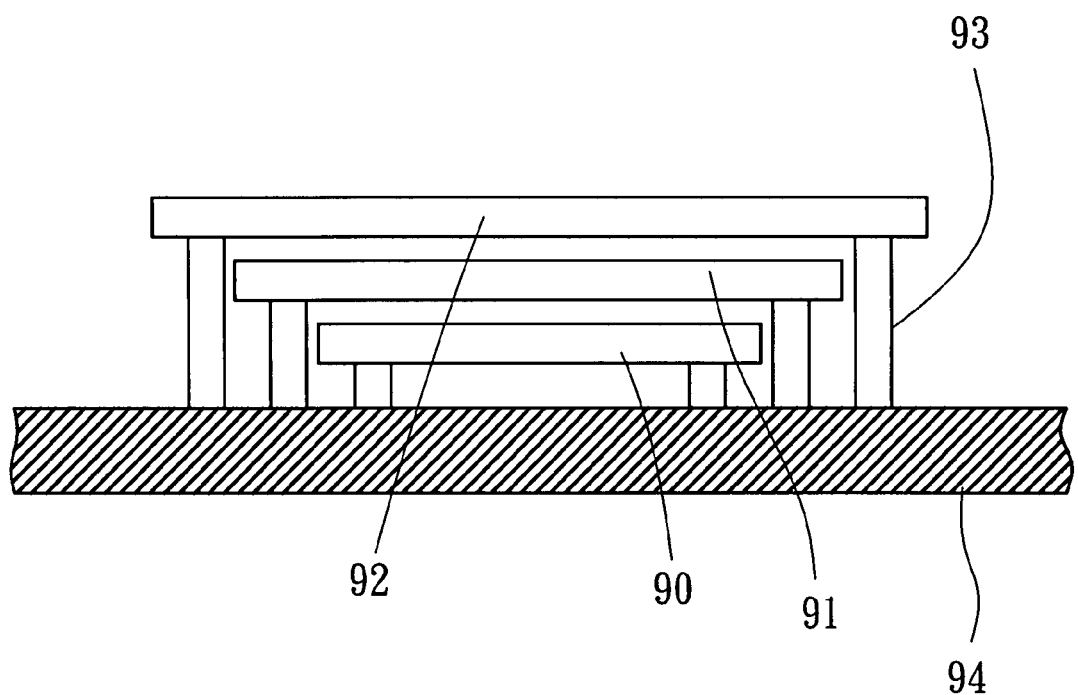
FIG. 6 is a schematic view of assembling an integrated-type LED in accordance with a preferred embodiment of the present invention.

Referring to FIG. 6, three different color LED chips: red (R) LED chip 90, blue (B) LED chip 91 and green (G) LED chip 92 are stacked, connected, conducted and fixed, and their P and N electrodes are soldered directly to a multi-layer base board 94 by a conductor 93. Therefore, the three colors R, B, G can be mixed to produce a white light LED and achieve an LED with a full color light effect.

Further, the aforementioned LED can be packaged to achieve a focusing effect.

In summation of the description above, the present invention enhance the prior art and also complies with the patent application requirements. The description and its accompanied drawings are used for describing preferred embodiments of the present invention, and it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated-type LED, comprising:
a base board having a preinstalled circuit; and
a plurality of non-packaged LED flip chips being directly arranged on the preinstalled circuit, wherein the non-packaged LED flip chips are connected, conducted and fixed onto the circuit of the base board, each non-packaged the LED flip chip having a front side facing towards the circuit of the base board and comprising a solder mask and oxidation-resisting layer and further comprising P and N electrodes;
wherein the non-packaged LED flip chips are red, blue and green LED chips, and the base board is a multi-layer base board, and the red, blue and green LED chips are stacked in piles having their lighting areas overlapped on the base board and the P and N electrodes of each LED flip chip are soldered directly onto the base board.

2. The integrated-type LED as claimed in claim 1, wherein the P and N electrodes of the non-packaged LED flip chips are connected, conducted and fixed to the circuit of the base board by solder paste, conductive adhesive, gold ball, solder ball or silver ball soldering.

3. The integrated-type LED as claimed in claim 1, further comprising a packaging layer for encapsulating the LED flip chips therein.

4. A method for manufacturing an integrated-type LED as claimed in claim 1, comprising the steps of:
(a) providing a circuit on a base board; and
(b) utilizing solder paste and a solder furnace to directly solder a plurality of non-packaged LED flip chips onto the base board, and also aligning P and N electrodes of the non-packaged LED flip chip to conducting nodes of the circuit of the base board, each non-packaged the LED flip chip having a front side facing towards the circuit of the base board and comprising a solder mask and oxidation-resisting layer.

5. The method for manufacturing an integrated-type LED as claimed in claim 4, wherein the base board is a multi-layer printed circuit board (PCB) and the non-packaged LED flip chips comprise three LED chips with different colors, which is red (R), blue (B) and green (G), each of the non-packaged LED chips having a P electrode and an N electrode respectively and electrically connected to the PCB by two conductors via the solder paste, the three chips being separated from one another and corresponding to one another such that the three colors R, B, G can be mixed to produce a white light LED and achieve an LED with full color light effect.

6. The method for manufacturing an integrated-type LED as claimed in claims 4, further comprising a step of packaging the non-packaged LED flip chips.

* * * * *